United States Patent
Broyde et al.

(10) Patent No.: US 9,525,465 B2
(45) Date of Patent: *Dec. 20, 2016

(54) TRANSMITTER FOR NEAR-FIELD CHIP-TO-CHIP MULTICHANNEL TRANSMISSION

(75) Inventors: Frederic Broyde, Maule (FR); Evelyne Clavelier, Maule (FR)

(73) Assignee: Apple Inc., Cupertino, CA (US)

(*) Notice: Subject to any disclaimer, the term of this patent is extended or adjusted under 35 U.S.C. 154(b) by 189 days.

This patent is subject to a terminal disclaimer.

(21) Appl. No.: 14/128,440

(22) PCT Filed: May 30, 2012

(86) PCT No.: PCT/IB2012/052709
§ 371 (c)(1),
(2), (4) Date: Jun. 3, 2014

(87) PCT Pub. No.: WO2012/176081
PCT Pub. Date: Dec. 27, 2012

(65) Prior Publication Data
US 2014/0315486 A1    Oct. 23, 2014

(30) Foreign Application Priority Data
Jun. 21, 2011 (FR) .................................. 11 01902

(51) Int. Cl.
*H04B 5/00* (2006.01)
*H01L 25/065* (2006.01)

(52) U.S. Cl.
CPC .......... *H04B 5/0075* (2013.01); *H01L 25/0657* (2013.01); *H01L 2924/0002* (2013.01); *H04B 5/0012* (2013.01)

(58) Field of Classification Search
CPC ........................................................ H04B 5/00
See application file for complete search history.

(56) References Cited

U.S. PATENT DOCUMENTS

2008/0064331 A1* 3/2008 Washiro ............... H04B 5/0012
455/41.1
2008/0117117 A1* 5/2008 Washiro ............... H01Q 1/2225
343/850
2008/0153416 A1* 6/2008 Washiro .................. H04B 5/00
455/41.1
2009/0176450 A1* 7/2009 Chow ..................... H01L 23/48
455/41.1
2009/0218407 A1* 9/2009 Rofougaran ....... G06K 19/0724
235/492

(Continued)

FOREIGN PATENT DOCUMENTS

WO     2010/004445 A1    1/2010
WO     2010004445        1/2010

OTHER PUBLICATIONS

FR Application No. 1101902, Search Report, dated Feb. 6, 2012.
(Continued)

*Primary Examiner* — Cindy Trandai
(74) *Attorney, Agent, or Firm* — Meyertons, Hood, Kivlin, Kowert & Goetzel, P.C.

(57) ABSTRACT

This application relates to a transmitter for a near-field chip-to-chip multichannel transmission system such as the capacitive or inductive links used for vertical signal transmission between the stacked chips of a system-in-package. A transmitter for near-field chip-to-chip multichannel transmission providing 4 transmission channels for digital transmission between two monolithic integrated circuits comprises 4 coupling devices, each of said coupling devices being a planar winding sensitive to magnetic field variations. A multiple-input-port and multiple-output-port amplifier has 4 output ports, each of said output ports being connected to one and only one of said coupling devices. The transmitter also includes 4 signal shaping circuits, each of said signal shaping circuits having an input port connected to the source, each of said signal shaping circuits having an output port connected to one of the input ports of the multiple-input-port and multiple-output-port amplifier.

20 Claims, 5 Drawing Sheets

(56) References Cited

U.S. PATENT DOCUMENTS

| | | | | |
|---|---|---|---|---|
| 2010/0124295 A1* | 5/2010 | Broyde | .............. | H04L 25/0272 375/260 |
| 2010/0248673 A1* | 9/2010 | Broyde | ................... | H04B 7/08 455/278.1 |
| 2011/0130093 A1* | 6/2011 | Walley | ............... | G06K 7/10207 455/41.1 |
| 2011/0193817 A1* | 8/2011 | Byun | ................... | G06F 3/0418 345/174 |

OTHER PUBLICATIONS

Yoshida, Y., et al.: "A 2 Gb/s Bi-Directional Inter-Chip Data Transceiver with Differential Inductors for High Density Inductive Channel Array," IEEE Journal of Solid-State Circuits, IEEE Service Center, Piscataway, NJ, USA, vol. 43, No. 11 (Nov. 1, 2008), pp. 2363-2369, XP011238708, ISSN: 0018-9200DOI: 10.1109/JSSC.2008.2004530.

Fazzi, A., et al.: "3-D Capacitive Interconnections for Wafer-Level and Die-Level Assembly," IEEE Journal of Solid-State Circuits, IEEE Service Center, Piscataway, NJ, USA, vol. 42, No. 10, (Oct. 1, 2007), pp. 2270-2282, XP011193060, ISSN: 0018-9200, DOI: 10.1109/JSSC.2007.905230.

PCT Application No. PCT/IB2012/052709, International Search Report and Written Opinion, mailed Aug. 3, 2012.

Office Action from Korean Application No. 1020137033602, issued Jan. 28, 2015, English and Korean versions, pp. 1-12.

"A 2 Gb/s Bi-Directional Inter-Chip Data Transceiver With Differential Inductors for High Density Inductive Channel Array" Yoshida et al., Nov. 2008, pp. 2363-2369.

"3-D Capacitive Interconnections for Wafer-Level and Die-Level Assembly", Fazzi et al., Oct. 2007, pp. 2270-2282.

\* cited by examiner

TRANSMITTER FOR NEAR-FIELD CHIP-TO-CHIP MULTICHANNEL TRANSMISSION

PRIORITY CLAIM

This application is a national stage application of and claims the benefit of priority from international patent application number PCT/IB2012/052709, entitled "Transmitter for Near-Field Chip-to-Chip Multichannel Transmission" and internationally-filed on May 30, 2012, which claims the benefit of priority from France national patent application number 1101902, entitled "Emetteur pour transmision multivoie puce-à-puce en champ proche" and filed on Jun. 21, 2011, both of which are fully incorporated herein by reference for all purposes, to the extent not inconsistent with this application.

FIELD OF THE INVENTION

The invention relates to a transmitter for a near-field chip-to-chip multichannel transmission system such as the capacitive or inductive links used for vertical signal transmission between the stacked chips of a system-in-package (SiP) using three-dimensional (3-D) integration.

The French patent application number 11/01902 of 21 Jun. 2011, entitled "Emetteur pour transmision multivoie puce-à-puce en champ proche" is incorporated by reference.

PRIOR ART

Three-dimensional integration is a new technology that enables an effective integration of complex systems. In a package using three-dimensional integration, chips may be stacked and structurally combined. In such a system-in-package, the vertical distance for signal transmission between two chips is typically smaller than 200 µm. Many vertical chip-to-chip transmission techniques have been developed. Techniques using through-silicon vias (TSVs) are expensive due to the increase of manufacturing process complexity. Techniques using near-field chip-to-chip transmission do not increase the process complexity.

The FIG. 1 shows the coupling devices of a near-field chip-to-chip multichannel transmission system providing m=12 transmission channels between a first monolithic integrated circuit (1) and a second monolithic integrated circuit (2), the near-field chip-to-chip multichannel transmission system comprising:

a first array of coupling devices (11) built in a metallization level of the first monolithic integrated circuit (1), a coupling device (111) of the first array of coupling devices (11) being sensitive to electric field variations and/or to magnetic field variations, the first array of coupling devices (11) consisting of m coupling devices;

a second array of coupling devices (21) built in a metallization level of the second monolithic integrated circuit (2), a coupling device (211) of the second array of coupling devices (21) being sensitive to electric field variations and/or to magnetic field variations, the second array of coupling devices (21) consisting of m coupling devices, a coupling device (211) of the second array of coupling devices (21) facing a single coupling device (111) of the first array of coupling devices (11).

A coupling device sensitive to electric field variations, for instance a conducting surface having a sufficient area (referred to as a capacitor plate by some authors), can be used for receiving an electric field used for signal transmission and can also be used for sending an electric field used for signal transmission. A coupling device sensitive to magnetic field variations, for instance a winding (referred to as coil or inductor by some authors), can be used for receiving a magnetic field used for signal transmission and can also be used for sending a magnetic field used for signal transmission. More generally, a coupling device may be any device sensitive to electric field variations and/or to magnetic field variations, for instance a device comprising a combination of conducting surfaces and/or of windings.

The FIG. 2 shows the block-diagram of a first example of a transmitter of a near-field multichannel transmission system providing m=4 transmission channels for digital transmission between two monolithic integrated circuits, comprising:

m signal shaping circuits (181) (182) (183) (184), each of said signal shaping circuits having an input port connected to the source (19);

m single-ended input and single-ended output amplifiers (121) (122) (123) (124), each single-ended input and single-ended output amplifier having its input terminal connected to the output terminal of one and only one signal shaping circuit (181) (182) (183) (184);

m coupling devices (111) (112) (113) (114), each coupling device being a planar winding sensitive to magnetic field variations, each coupling device having a first terminal and a second terminal, the first terminal being connected to the output terminal of one and only one single-ended input and single-ended output amplifier (121) (122) (123) (124), the second terminal being grounded.

The FIG. 3 shows the block-diagram of a second example of a transmitter of a near-field multichannel transmission system providing m=4 transmission channels for digital transmission between two monolithic integrated circuits, comprising:

m signal shaping circuits (181) (182) (183) (184), each of said signal shaping circuits having an input port connected to the source (19);

m differential input and differential output amplifiers (121) (122) (123) (124), each differential input and differential output amplifier having an input port connected to the output port of one and only one of said signal shaping circuits (181) (182) (183) (184);

m coupling devices (111) (112) (113) (114), each coupling device being a planar winding sensitive to magnetic field variations, each coupling device having a first terminal and a second terminal, the first terminal and the second terminal being connected to the output port of one and only one differential input and differential output amplifier (121) (122) (123) (124).

In the FIGS. 2 and 3, the signal shaping circuits deliver signals which are suitable for the chosen signaling technique. A signal shaping circuit can use different types of circuits, which are well known to specialists. For instance, a signal shaping circuit may generate pulses corresponding to one of the pulse code modulation (PCM) formats. For instance, a signal shaping circuit may generate a modulated carrier. The enable and/or clock and/or control lines which may be necessary for the operation of the signal shaping circuits are not shown in the FIGS. 2 and 3.

Even though each coupling device may be considered as an electrically small antenna in the meaning of antenna theory, it is important to note that, in a near-field chip-to-chip multichannel transmission system, an array of coupling devices is not used as an array of antennas in the meaning of antenna theory. This is because the array of coupling devices operates in a near-field transmission system in which the electric and magnetic fields decrease very rapidly with distance. Thus, in an ideal case, a coupling device used for receiving an electric field and/or a magnetic field only senses the electric field and/or magnetic field variations produced by the nearest coupling device used for sending an electric field and/or a magnetic field. For instance, in FIG. 1 where a coupling device (211) of the second array of coupling devices (21) faces a single coupling device (111) of the first array of coupling devices (11), it is possible that signal transmission mainly occurs between coupling devices facing each other, either from the first monolithic integrated circuit (1) to the second monolithic integrated circuit (2), or from the second monolithic integrated circuit (2) to the first monolithic integrated circuit (1).

However, some unwanted couplings unavoidably occur, which produce crosstalk between the transmission channels. Unfortunately, this internal crosstalk limits the number of channels which can be used in a given area. This internal crosstalk has three causes:

a coupling device of one of the arrays of coupling devices may be significantly coupled with more than one coupling device of the other array of coupling devices, because signal transmission does not only occur between coupling devices facing each other;

the coupling devices of the first array of coupling devices interact;

the coupling devices of the second array of coupling devices interact.

For instance, the article of A. Fazzi, L. Magagni, M. Mirandola, B. Charlet, L. Di Cioccio, E. Jung, R. Canegallo and R. Guerrieri entitled "3-D Capacitive Interconnections for Wafer-Level and Die-Level Assembly" published in the IEEE Journal of Solid-State Circuits, vol. 42, No. 10, pp. 2270-2282 in October 2007 relates to a near-field chip-to-chip multichannel transmission system using electric field variations for signal transmission. This paper discusses crosstalk between the transmission channels.

For instance, the article of Y. Yoshida, N. Miura and Tadahiro Kuroda entitled "A 2 Gb/s Bi-Directional Inter-Chip Data Transceiver With Differential Inductors for High Density Inductive Channel Array" published in the IEEE Journal ofSolid-State Circuits, vol. 43, No. 11, pp. 2363-2369 in November 2008 relates to a near-field chip-to-chip multichannel transmission system using magnetic field variations for signal transmission. This paper stresses the detrimental effects of crosstalk and introduces the use of special windings, referred to as "differential inductors", for reducing crosstalk. Unfortunately, such special windings produce a lower wanted coupling for a given area and provide only a partial reduction of crosstalk.

SUMMARY OF THE INVENTION

The purpose of the invention is a transmitter for near-field chip-to-chip multichannel transmission which overcomes the above-mentioned limitations of known techniques.

According to the invention, a transmitter of a near-field multichannel transmission system providing m transmission channels each corresponding to a signal to be sent from a first monolithic integrated circuit to a second monolithic integrated circuit, where m is an integer greater than or equal to 2, the first monolithic integrated circuit and the second monolithic integrated circuit being structurally combined, comprises n coupling devices built in the first monolithic integrated circuit, where n is an integer greater than or equal to m, each of said coupling devices being subject to an electrical variable determined by two or more of said signals to be sent. According to the invention, each of said coupling devices is sensitive to electric field variations and/or to magnetic field variations. According to the invention, the electrical variable applied to one of said coupling devices may be a voltage or a current.

According to the invention, a transmitter of a near-field multichannel transmission system providing m transmission channels each corresponding to a signal to be sent from a first monolithic integrated circuit to a second monolithic integrated circuit, where m is an integer greater than or equal to 2, the first monolithic integrated circuit and the second monolithic integrated circuit being structurally combined may for instance comprise:

n coupling devices built in the first monolithic integrated circuit, where n is an integer greater than or equal to m, each of said coupling devices being sensitive to electric field variations and/or to magnetic field variations;

a multiple-input-port and multiple-output-port amplifier, said multiple-input-port and multiple-output-port amplifier being built in the first monolithic integrated circuit, said multiple-input-port and multiple-output-port amplifier having m input ports and n output ports, each of said output ports being connected to one and only one of said coupling devices, each of said coupling devices being connected to one and only one of said output ports, said multiple-input-port and multiple-output-port amplifier having, when said multiple-input-port and multiple-output-port amplifier is in the activated state, for small signals, at each frequency in a frequency band used for transmission, a short-circuit transfer admittance matrix, said short-circuit transfer admittance matrix being a complex matrix of size n×m, two or more entries of each row of said short-circuit transfer admittance matrix being different from zero.

Let us number, from 1 to m, the input ports of the multiple-input-port and multiple-output-port amplifier. Any integer j greater than or equal to 1 and less than or equal to m corresponds to the number of an input port of the multiple-input-port and multiple-output-port amplifier. Let us define the input current $i_{Ij}$ flowing into the positive terminal of the input port j, and the input voltage $v_{Ij}$ between the positive terminal of the input port j and the negative terminal of the input port j. We also define the column-vector $I_I$ of the input currents $i_{I1}, \ldots, i_{Im}$ and the column-vector $V_I$ of the input voltages $v_{I1}, \ldots, v_{Im}$. Let us number, from 1 to n, the output ports of the multiple-input-port and multiple-output-port amplifier. Any integer k greater than or equal to 1 and less than or equal to n corresponds to the number of an output port of the multiple-input-port and multiple-output-port amplifier. Let us define the output current $i_{Ok}$ flowing into the positive terminal of the output port k, and the output voltage $v_{Ok}$ between the positive terminal of the output port k and the negative terminal of the output port k. We also define the column-vector of the output currents $i_{O1}, \ldots, i_{On}$ and the column-vector $V_O$ of the output voltages $v_{O1}, \ldots, v_{On}$. When the multiple-input-port and multiple-output-port amplifier is in the activated state, for small signals, the multiple-input-port and multiple-output-port amplifier is characterized, in frequency domain, by the two following equations:

$$I_I = Y_I V + Y_R V_O \quad (1)$$

$$I_O = Y_T V_I + Y_O V_O \quad (2)$$

where $Y_I$ is a square m×m matrix, where $Y_O$ is a square n×n matrix, where $Y_R$ is a m×n matrix and where $Y_T$ is a n×m matrix. All components of these matrices have the dimensions of admittance. Consequently, specialists understand that they can refer to $Y_I$ as the "short-circuit input admittance matrix" of the amplifier, to $Y_R$ as the "short-circuit reverse transfer admittance matrix" of the amplifier, to $Y_T$ as the "short-circuit transfer admittance matrix" of the amplifier, and to $Y_O$ as the "short-circuit output admittance matrix" of the amplifier. These four matrices have complex components and may be frequency-dependent.

Two or more entries of each row of said short-circuit transfer admittance matrix may be significantly different from zero. For instance, said multiple-input-port and multiple-output-port amplifier may be such that, at each frequency in said frequency band used for transmission, in each row of said short-circuit transfer admittance matrix, at least one entry different from an entry having the greatest absolute value has an absolute value greater than $\frac{1}{100}$ times the absolute value of said entry having the greatest absolute value. For instance, said multiple-input-port and multiple-output-port amplifier may be such that, at each frequency in said frequency band used for transmission, in each row of said short-circuit transfer admittance matrix, at least one entry different from an entry having the greatest absolute value has an absolute value greater than $\frac{1}{10}$ times the absolute value of said entry having the greatest absolute value.

In the following, the wordings "is in the deactivated state" and "is not in the activated state" are equivalent.

The multiple-input-port and multiple-output-port amplifier in the activated state has, for small signals, at each frequency in a frequency band used for transmission, a short-circuit transfer admittance matrix, said short-circuit transfer admittance matrix being a complex matrix of size n×m, two or more entries of each row of said short-circuit transfer admittance matrix being significantly different from zero. According to the invention, it is possible that there is a deactivated state of the multiple-input-port and multiple-output-port amplifier, in which the behavior of the multiple-input-port and multiple-output-port amplifier is different. However, the existence of a deactivated state of the multiple-input-port and multiple-output-port amplifier is not at all a characteristic of the invention.

According to the invention, said n coupling devices built in the first monolithic integrated circuit are used for sending an electric field and/or a magnetic field, as parts of a near-field transmission system providing m transmission channels each corresponding to a signal to be sent from the first monolithic integrated circuit to the second monolithic integrated circuit. Said n coupling devices built in the first monolithic integrated circuit can also be used for receiving an electric field and/or a magnetic field, as parts of a near-field transmission system providing one or more transmission channels each corresponding to a signal to be sent from the second monolithic integrated circuit to the first monolithic integrated circuit. Thus, a bidirectional transmission is obtained. The specialist understands how this result can be obtained, for instance using controlled analog switches and/or a deactivated state of the multiple-input-port and multiple-output-port amplifier.

According to the invention, the first monolithic integrated circuit and the second monolithic integrated circuit are structurally combined, so that the first and second monolithic integrated circuits have fixed relative positions. The specialist understands that this requirement allows the designer to compute the effects of the three above-mentioned causes of internal crosstalk, and to determine a set of short-circuit transfer admittance matrices which can each cancel internal crosstalk between the signals delivered by the coupling devices built in the second monolithic integrated circuit.

According to the invention, at least one other monolithic integrated circuit can be structurally combined with the first monolithic integrated circuit and/or the second monolithic integrated circuit. In this case:

the transmitter of the invention can also be used as a part of a near-field transmission system providing one or more transmission channels each corresponding to a signal to be sent from the first monolithic integrated circuit to said at least one other monolithic integrated circuit;

the n coupling devices built in the first monolithic integrated circuit can also be used for receiving an electric field and/or a magnetic field, as parts of a near-field transmission system providing one or more transmission channels each corresponding to a signal to be sent from said at least one other monolithic integrated circuit to the first monolithic integrated circuit.

The multiple-input-port and multiple-output-port amplifier may for instance be such that the negative terminals of its input ports and/or of its output ports correspond to ground, such ports being single-ended in this case.

The multiple-input-port and multiple-output-port amplifier may for instance be such that each of its input ports corresponds to a differential input and/or such that each of its output ports corresponds to a differential output.

The multiple-input-port and multiple-output-port amplifier may comprise a multiple-input and multiple-output series-series feedback amplifier, for instance described in the French patent application number 06/00388 of 17 Jan. 2006 entitled "Amplificateur a entrees multiples et sorties multiples", in the corresponding international application number PCT/IB2006/003950 of 19 Dec. 2006 (WO 2007/083191) entitled "Multiple-input and multiple-output amplifier", in the French patent application number 06/05633 of 23 Jun. 2006 entitled "Amplificateur a entrees multiples et sorties multiples utilisant l'induction mutuelle dans le reseau de retroaction", and in the corresponding international application number PCT/IB2007/001344 of 26 Apr. 2007 (WO 2008/00 1168) entitled "Multiple-input and multiple-output amplifier using mutual induction in the feedback network".

The multiple-input-port and multiple-output-port amplifier may comprise a multiple-input and multiple-output series-series feedback amplifier having pseudo-differential inputs, for instance described in the French patent application number 08/03982 of 11 Jul. 2008, entitled "Amplificateur a entrees multiples et sorties multiples avant des entrees pseudo-differentielles" and in the corresponding international application number PCT/IB2009/051358 of 31 Mar. 2009 (WO 201 0/004445) entitled "Multiple-input and multiple-output amplifier having pseudo-differential inputs".

BRIEF DESCRIPTION OF THE DRAWINGS

Other advantages and characteristics will appear more clearly from the following description of particular embodiments of the invention, given by way of non-limiting examples, with reference to the accompanying drawings in which.

DETAILED DESCRIPTION OF SOME EMBODIMENTS

First Embodiment

Figure 1:
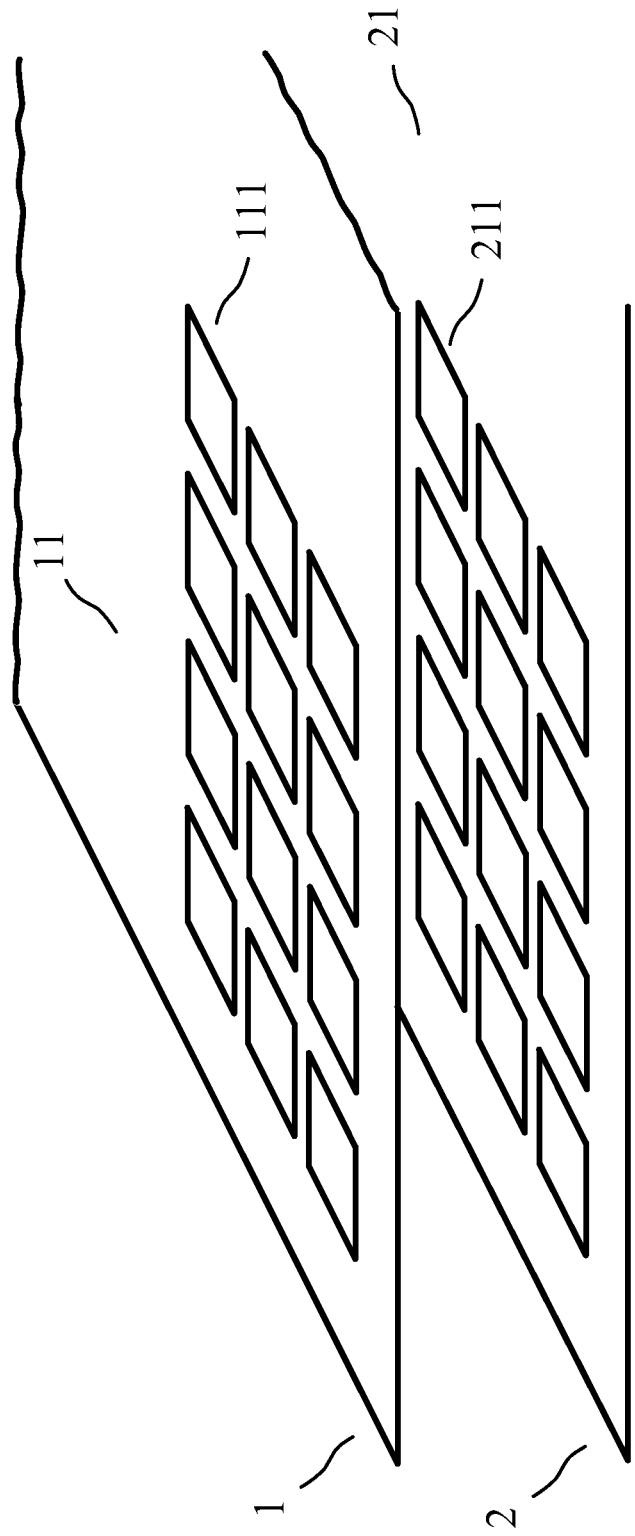
FIG. 1 shows the coupling devices of a near-field chip-to-chip multichannel transmission system, and has already been discussed in the section dedicated to the presentation of prior art.
Figure 2:
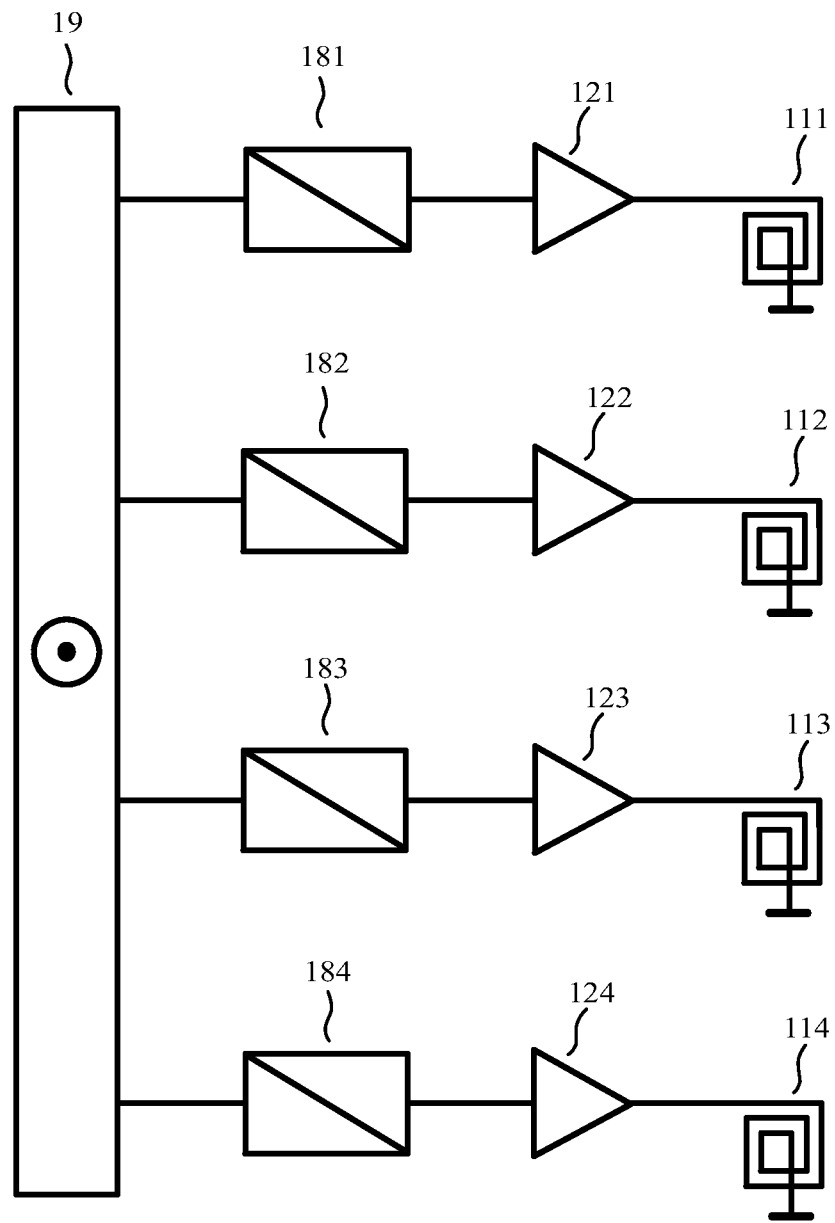
FIG. 2 shows the block-diagram of a first example of a transmitter for a near-field chip-to-chip multichannel transmission system, and has already been discussed in the section dedicated to the presentation of prior art.
Figure 3:
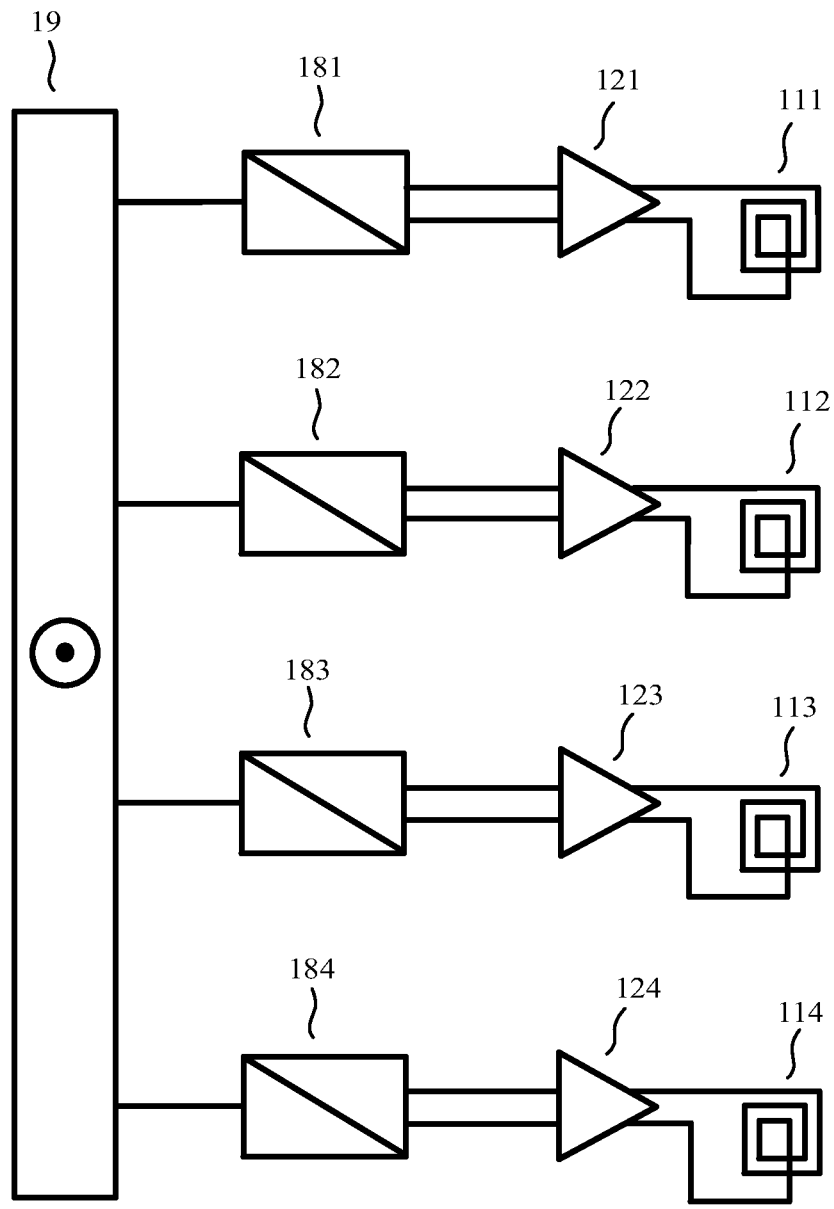
FIG. 3 shows the block-diagram of a second example of a transmitter for a near-field chip-to-chip multichannel transmission system, and has already been discussed in the section dedicated to the presentation of prior art.
Figure 4:
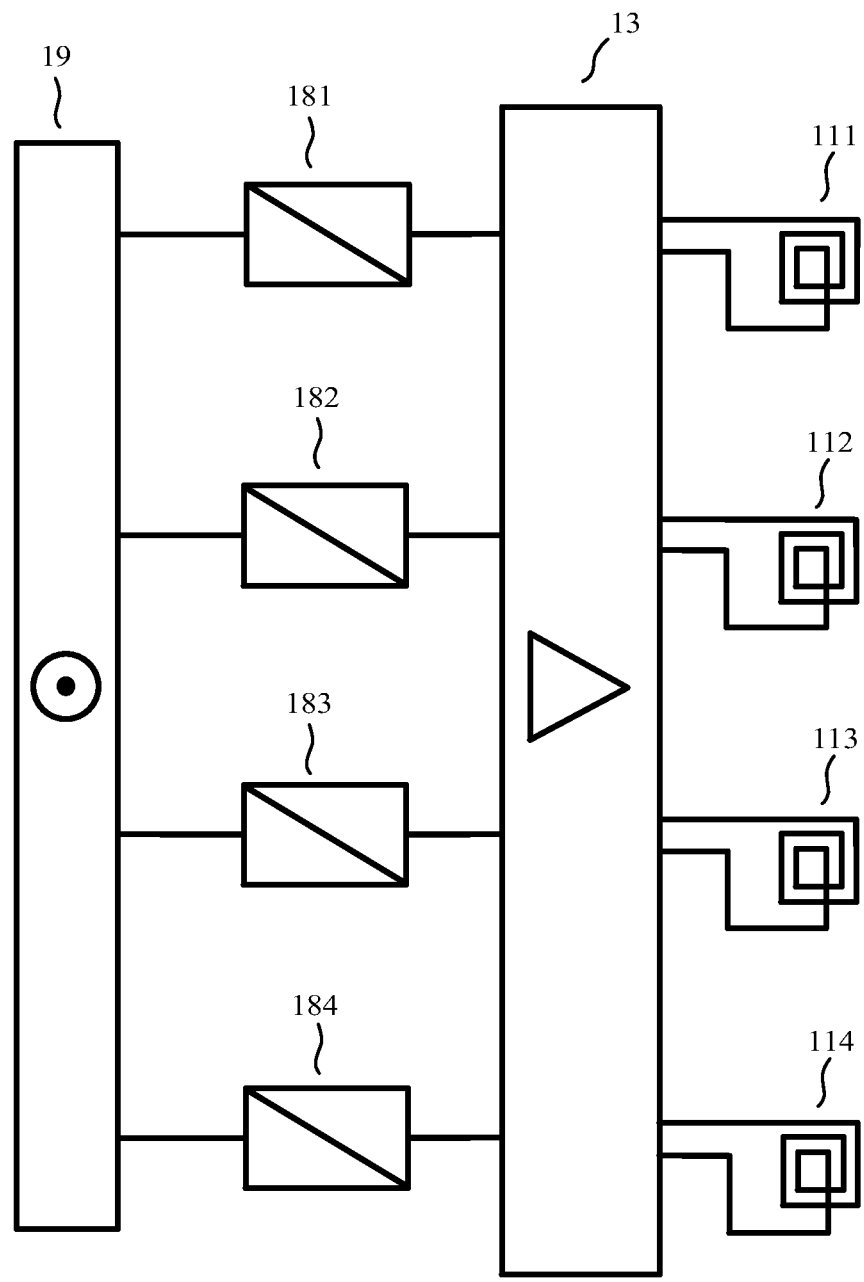
FIG. 4 shows the block diagram of a first embodiment of the invention.

As a first embodiment of a device of the invention, given by way of non-limiting example, we have represented in FIG. 4 the block diagram of a transmitter for near-field chip-to-chip multichannel transmission providing m=4 transmission channels for digital transmission from a first monolithic integrated circuit to a second monolithic integrated circuit, comprising:

n=4 coupling devices (111) (112) (113) (114) built in the first monolithic integrated circuit, each of said coupling devices being a planar winding sensitive to magnetic field variations;

a multiple-input-port and multiple-output-port amplifier (13) built in the first monolithic integrated circuit, said multiple-input-port and multiple-output-port amplifier having m input ports and n output ports, each of said output ports being connected to one and only one of said coupling devices (111) (112) (113) (114), each of said coupling devices (111) (112) (113) (114) being connected to one and only one of said output ports, said multiple-input-port and multiple-output-port amplifier having, when said multiple-input-port and multiple-output-port amplifier is in the activated state, for small signals, at each frequency in a frequency band used for transmission, a short-circuit transfer admittance matrix, said short-circuit transfer admittance matrix being a complex matrix of size n x m, two or more entries of each row of said short-circuit transfer admittance matrix being significantly different from zero;

m signal shaping circuits (181) (182) (183) (184), each of said signal shaping circuits having an input port connected to the source (19), each of said signal shaping circuits having an output port connected to one of the input ports of the multiple-input-port and multiple-output-port amplifier (13).

The transmitter shown in FIG. 4 is a part of a near-field multichannel transmission system which also comprises a receiver comprising n coupling devices built in the second monolithic integrated circuit, each of these coupling devices being a planar winding sensitive to magnetic field variations. All interactions between said 2n coupling devices built in the first monolithic integrated circuit and in the second monolithic integrated circuit are described by the following equations:

$$V_O = -j\omega(L_T I_O + L_C I_R) - R_T I_O \quad (3)$$

$$V_R = -j\omega({}^t L_C I_O + L_R I_R) - R_R I_R \quad (4)$$

where $\omega$ is the radian frequency, where $L_T$, $L_C$, $L_R$, $R_T$ and $R_R$ are square n×n real matrices, where ${}^t X$ denotes the transpose of a matrix X, where $I_R$ is the column-vector of the currents delivered by the coupling devices built in the second monolithic integrated circuit, where $V_R$ is the column-vector of the voltages across the coupling devices built in the second monolithic integrated circuit, and where $V_O$ and $I_O$ are defined above.

All entries of the matrices $L_T$, $L_C$ and $L_R$, have the dimensions of inductance. All entries of the matrices $R_T$ and $R_R$ have the dimensions of resistance. The first monolithic integrated circuit and the second monolithic integrated circuit being structurally combined, the specialist understands that it is possible to compute the matrices $L_T$, $L_C$, $L_R$, $R_T$ and $R_R$. In this first embodiment, the designer uses a multiple-input-port and multiple-output-port amplifier such that all entries of $Y_O$, $Y_R$, and $Y_I$ have a small absolute value in the frequency band used for transmission, so that the voltages across the coupling devices built in the second monolithic integrated circuit are approximately given by $$V_R = -j\omega({}^t L_C Y_T V_I + L_R I_R) - R_R I_R \quad (5)$$

The designer uses a receiver presenting a high impedance to each of the coupling devices built in the second monolithic integrated circuit. Thus, the specialist understands that the set of the short-circuit transfer admittance matrices which can each cancel the crosstalk between the voltages across the coupling devices built in the second monolithic integrated circuit is defined by the condition $$Y_T \approx {}^t L_C^{-1} D \quad (6)$$

where D is a diagonal complex matrix, D being arbitrary and possibly frequency-dependent. Thus, the designer may design a multiple-input-port and multiple-output-port amplifier such that said short-circuit transfer admittance matrix is the product of a frequency-independent real matrix and a diagonal matrix. A suitable short-circuit transfer admittance matrix may be obtained using a multiple-input and multiple-output series-series feedback amplifier or a multiple-input and multiple-output series-series feedback amplifier having pseudo-differential inputs. Thus, the multiple-input-port and multiple-output-port amplifier may use a feedback providing, at each frequency in said frequency band used for transmission, a short-circuit transfer admittance matrix such that two or more entries of each row of said short-circuit transfer admittance matrix are significantly different from zero.

Second Embodiment

Figure 5:
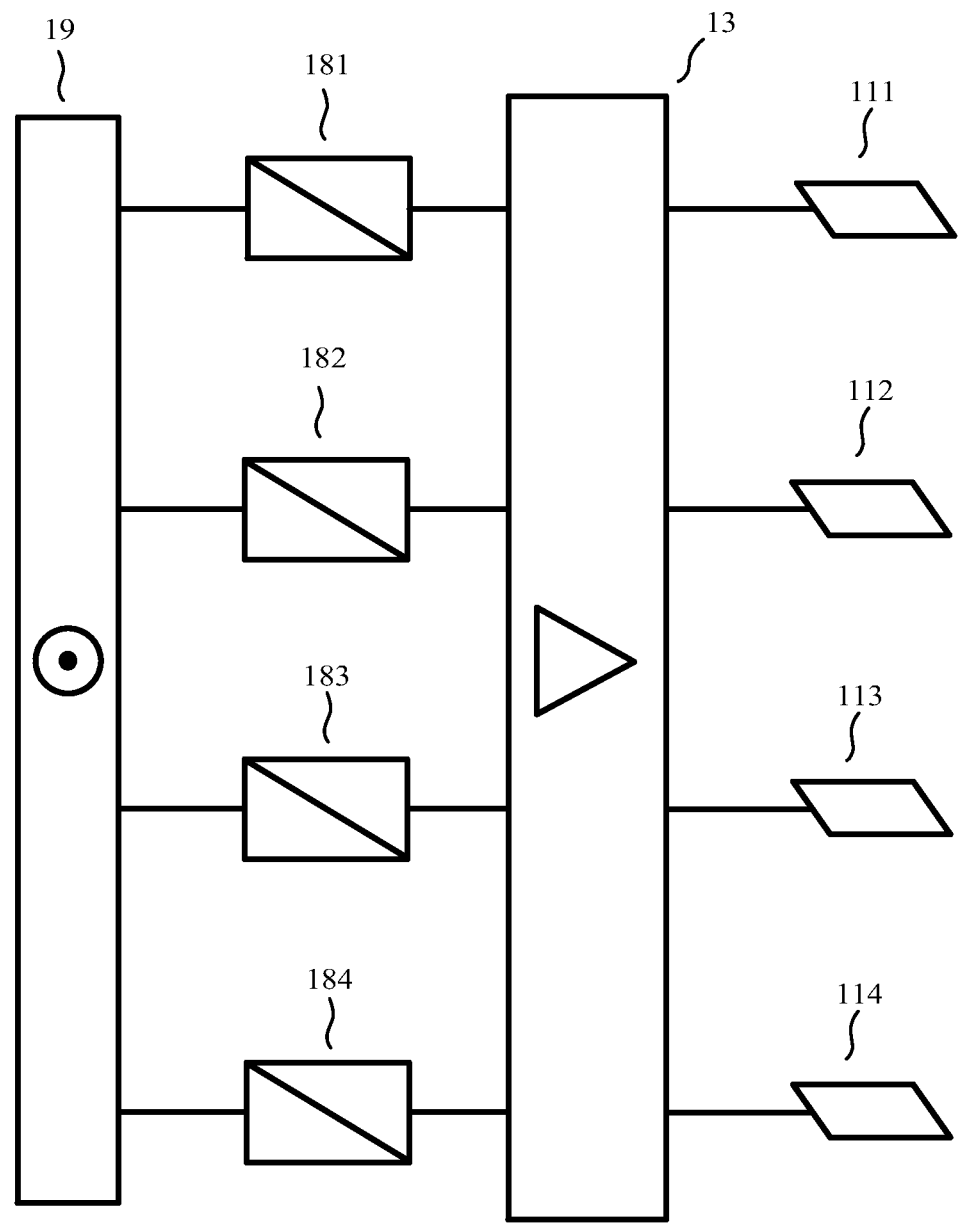
FIG. 5 shows the block diagram of a second embodiment of the invention.

As a second embodiment of a device of the invention, given by way of non-limiting example, we have represented in FIG. 5 the block diagram of a transmitter for near-field chip-to-chip multichannel transmission providing m=4 transmission channels for digital transmission from a first monolithic integrated circuit to a second monolithic integrated circuit, comprising:

n=4 coupling devices (111) (112) (113) (114) built in the first monolithic integrated circuit, each of said coupling devices being a conducting surface sensitive to electric field variations;

a multiple-input-port and multiple-output-port amplifier (13) built in the first monolithic integrated circuit, said multiple-input-port and multiple-output-port amplifier having m input ports and n output ports, each of said output ports being connected to one and only one of said coupling devices (111) (112) (113) (114), each of said coupling devices (111) (112) (113) (114) being connected to one and only one of said output ports, said multiple-input-port and multiple-output-port amplifier having, when said multiple-input-port and multiple-output-port amplifier is in the activated state, for small signals, at each frequency in a frequency band used for transmission, a short-circuit transfer admittance matrix, said short-circuit transfer admittance matrix being a complex matrix of size n×m, two or more entries of each row of said short-circuit transfer admittance matrix being different from zero;

m signal shaping circuits (181) (182) (183) (184), each of said signal shaping circuits having an input port connected to the source (19), each of said signal shaping circuits having an output port connected to one of the input ports of the multiple-input-port and multiple-output-port amplifier (13).

The transmitter shown in FIG. 5 is a part of a near-field multichannel transmission system which also comprises a receiver comprising n coupling devices built in the second monolithic integrated circuit, each of these coupling devices being a conducting surface sensitive to electric field variations. All interactions between the 2n coupling devices built in the first monolithic integrated circuit and in the second monolithic integrated circuit are described by the following equations:

$$I_O = -j\omega(C_T V_O + C_C V_R) \quad (7)$$

$$I_R = -j\omega(C_C V_O + C_R V_R) \quad (8)$$

where $C_T$, $C_C$ and $C_R$ are square n x n real matrices, where $I_R$ is the column-vector of the currents delivered by the coupling devices built in the second monolithic integrated circuit, where $Y_R$ is the column-vector of the voltages across the coupling devices built in the second monolithic integrated circuit, and where $V_O$ and $I_O$ are defined above.

All entries of the matrices $C_T$, $C_C$ and $C_R$ have the dimensions of capacitance. The first monolithic integrated circuit and the second monolithic integrated circuit being structurally combined, the specialist understands that it is possible to compute the matrices $C_T$, $C_C$ and $C_R$. In this second embodiment, the designer uses a multiple-input-port and multiple-output-port amplifier such that all entries of $V_O$, $Y_R$, and $Y_I$ have a small absolute value in the frequency band used for transmission, so that the currents delivered by the coupling devices built in the second monolithic integrated circuit are approximately given by $$I_R = {}^tC_C C_T^{-1} Y_T V_I + j\omega({}^t C_C C_T^{-1} C_C - C_R) V_R \quad (9)$$

The designer uses a receiver presenting a low impedance to each of the coupling devices built in the second monolithic integrated circuit. Thus, the specialist understands that the set of the short-circuit transfer admittance matrices which can each cancel the crosstalk between the currents delivered by the coupling devices built in the second monolithic integrated circuit is defined by the condition $$Y_T \approx C_T^t C_C^{-1} D \quad (10)$$

where D is a diagonal complex matrix, D being arbitrary and possibly frequency-dependent. Thus, the designer may design a multiple-input-port and multiple-output-port amplifier such that said short-circuit transfer admittance matrix is the product of a frequency-independent real matrix and a diagonal matrix. A suitable short-circuit transfer admittance matrix may be obtained using a multiple-input and multiple-output series-series feedback amplifier or a multiple-input and multiple-output series-series feedback amplifier having pseudo-differential inputs.

Third Embodiment

A third embodiment of a device of the invention, given by way of non-limiting example, also corresponds to the block diagram of a transmitter for near-field chip-to-chip multichannel transmission shown in FIG. 5. What has been said above about the second embodiment is applicable to this third embodiment except that, in this third embodiment, $Y_O$ is equal to a diagonal real matrix denoted by $G_O$ such that the absolute value of each diagonal entry of $G_O$ is much greater than the absolute values of all entries of $j\omega$ $C_T$, in the frequency band used for transmission. This is because drivers having a low output impedance are used as output stage of the multiple-input-port and multiple-output-port amplifier. Thus, the currents delivered by the coupling devices built in the second monolithic integrated circuit are approximately given by $$I_R = j\omega({}^t C_C G_O^{-1} Y_T V_I - C_R V_R) \quad (11)$$

The designer uses a receiver presenting a low impedance to each of the coupling devices built in the second monolithic integrated circuit. Thus, the specialist understands that the set of the short-circuit transfer admittance matrices which can each cancel the crosstalk between the currents delivered by the coupling devices built in the second monolithic integrated circuit is defined by the condition $$Y_T \approx G_O {}^t C_C^{-1} D \quad (12)$$

where D is a diagonal complex matrix, D being arbitrary and possibly frequency-dependent. Thus, the designer may design a multiple-input-port and multiple-output-port amplifier such that said short-circuit transfer admittance matrix is the product of a frequency-independent real matrix and a diagonal matrix. A suitable short-circuit transfer admittance matrix may be obtained using a multiple-input and multiple-output series-series feedback amplifier or a multiple-input and multiple-output series-series feedback amplifier having pseudo-differential inputs.

Fourth Embodiment (Best Mode)

In a fourth embodiment of a device of the invention, given by way of non-limiting example and best mode of carrying out the invention, a transmitter for near-field chip-to-chip multichannel transmission providing m transmission channels each corresponding to a binary signal to be sent from a first monolithic integrated circuit to a second monolithic integrated circuit, where m is an integer greater than or equal to 2, comprises:

n=m coupling devices built in the first monolithic integrated circuit, each of said coupling devices being a multilayer winding sensitive to magnetic field variations;

a multiple-input-port and multiple-output-port circuit built in the first monolithic integrated circuit, said multiple-input-port and multiple-output-port circuit having n output ports, each of said output ports being connected to one and only one of said coupling devices, each of said coupling devices being connected to one and only one of said output ports, said multiple-input-port and multiple-output-port circuit being such that each of said coupling devices is subject to a current determined by two or more of said binary signals to be sent.

Let us number said binary signals from 1 to m. Let us also number said coupling devices from 1 to m. For an integer j greater than or equal to 1 and less than or equal to m, the multiple-input-port and multiple-output-port circuit receives the original signal $X_j$ and the complementary signal $\overline{X}_j$. The original signal $X_j$ is applied to the gate of an insulated gate field-effect transistor of the multiple-input-port and multiple-output-port circuit. The drain of this insulated gate field-effect transistor is coupled to the coupling device number j, and no current flows through this drain when $X_j = 0$. The complementary signal $\overline{X}_j$ is applied to the gate of one or more other insulated gate field-effect transistors of the multiple-input-port and multiple-output-port circuit. The drain of each of said one or more other insulated gate field-effect transistors is coupled to a coupling device other than the coupling device number j and no current flows through these drains when $\overline{X}_j=0$. Each coupling device being coupled to the drain of at least one insulated gate field-effect transistors to the gate of which a complementary signal is applied, each coupling device is subject to a current determined by two or more of the binary signals to be sent. The specialist understands that the channel widths of the insulated gate field-effect transistors can be proportioned such that the crosstalk between the voltages across the coupling devices built in the second monolithic integrated circuit internal is canceled.

The specialist understands that, in this fourth embodiment, the multiple-input-port and multiple-output-port circuit does not operate as a linear circuit. Thus, this fourth embodiment does not comprise a multiple-input-port and multiple-output-port amplifier for which a meaningful short-circuit transfer admittance matrix may be defined. This fourth embodiment reduces internal crosstalk and has a low power consumption.

INDICATIONS ON INDUSTRIAL APPLICATIONS

The transmitter for near-field chip-to-chip multichannel transmission of the invention can be used as a transmitter in the capacitive or inductive links used for vertical signal transmission between the stacked chips of a system-in-package using three-dimensional integration.

In the first, second and third embodiments of a device of the invention presented above, the transmitter for near-field chip-to-chip multichannel transmission of the invention provides m=4 transmission channels. This is not at all a characteristic of the invention. A transmitter for near-field chip-to-chip multichannel transmission of the invention may provide a large number of transmission channels.

The transmitter for near-field chip-to-chip multichannel transmission of the invention is suitable for sending analog signals and/or digital signals. The transmitter for near-field chip-to-chip multichannel transmission of the invention is suitable for sending signals using any type of modulation.

The transmitter for near-field chip-to-chip multichannel transmission of the invention has the advantage of reducing crosstalk between the transmission channels, over a wide bandwidth. The transmitter for near-field chip-to-chip multichannel transmission of the invention has the advantage of increasing the number of transmission channels which may be created in a given area. The transmitter for near-field chip-to-chip multichannel transmission of the invention has the advantage of increasing the transmission distance which may be obtained m a given area.

What is claimed is:

1. A transmitter of a near-field multichannel transmission system, the transmitter comprising:
   a plurality (M) of transmission channels, wherein each transmission channel of the M transmission channels corresponds to a respective signal of a plurality of signals to be sent from a first monolithic integrated circuit to a second monolithic integrated circuit, wherein M is an integer greater than or equal to 2, wherein the first monolithic integrated circuit and the second monolithic integrated circuit are structurally combined; and
   a plurality (N) of coupling devices built in the first monolithic integrated circuit, wherein N is an integer greater than or equal to M, wherein for each respective coupling device of the N coupling devices: a respective electrical variable applied to the respective coupling device is determined by two or more of the plurality of signals to be sent.

2. The transmitter of claim 1, wherein one or more of the N coupling devices is sensitive to electric field variations.

3. The transmitter of claim 1, wherein one or more of the N coupling devices is sensitive to magnetic field variations.

4. The transmitter of claim 1, further comprising:
   a multiple-input-port/multiple-output-port (MIOP) amplifier built in the first monolithic integrated circuit and comprising M input ports and N output ports;
   wherein each respective output port of the N output ports is coupled to a different corresponding coupling device of the N coupling devices;
   wherein in an activated state, the MIOP amplifier has, for small signals at each frequency in a frequency band used for transmission, a short-circuit transfer admittance matrix, wherein the short-circuit transfer admittance matrix is a complex matrix of size N×M, wherein two or more entries of each row of the short-circuit transfer admittance matrix are different from zero.

5. The transmitter of claim 4, wherein, at each frequency in the frequency band used for transmission, in each row of the short-circuit transfer admittance matrix, at least one entry different from an entry having the greatest absolute value has an absolute value greater than 1/100 times the absolute value of the entry having the greatest absolute value.

6. The transmitter of claim 4, wherein the short-circuit transfer admittance matrix is a product of a frequency-independent real matrix and a diagonal matrix.

7. The transmitter of claim 4, wherein the MIOP amplifier uses a feedback that provides, at each frequency in the frequency band used for transmission, a short-circuit transfer admittance matrix in which two or more entries of each row are significantly different from zero.

8. The transmitter of claim 4, wherein the MIOP amplifier comprises a multiple-input and multiple-output series-series feedback amplifier.

9. The transmitter of claim 8, wherein the multiple-input and multiple-output series-series feedback amplifier comprises pseudo-differential inputs.

10. The transmitter of claim 1, wherein the plurality of coupling devices are:
    comprised in a near-field transmission system providing one or more transmission channels; and
    configured to receive an electric field and/or a magnetic field;
    wherein each transmission channel of the one or more transmission channels corresponds to a respective signal to be sent from the second monolithic integrated circuit to the first monolithic integrated circuit.

11. The transmitter of claim 1, further comprising:
    a multiple-input-port/multiple-output-port (MIOP) amplifier built in the first monolithic integrated circuit and comprising M input ports and N output ports;
    wherein each respective input port of the M input ports is configured to receive a different respective corresponding signal of the plurality of signals to be sent;
    wherein each respective output port of the N output ports is coupled to a different corresponding coupling device of the N coupling devices; and
    wherein the MIOP amplifier is configured to generate each respective output signal provided at a corresponding respective output port of the N output ports based at least on two or more received different respective corresponding signals.

12. A transmitter of a near-field multichannel transmission system, the transmitter comprising:
- a plurality (M) of transmission channels, wherein each transmission channel of the M transmission channels corresponds to a respective signal of a plurality of binary signals to be sent from a first monolithic integrated circuit to a second monolithic integrated circuit, wherein M is an integer greater than or equal to 2;
- a plurality (N) of coupling devices comprised in the first monolithic integrated circuit, wherein N is an integer equal to M, wherein each coupling device of the N coupling devices comprises a multilayer winding sensitive to magnetic field variations; and
- a multiple-input-port and multiple-output-port (MIOP) circuit comprising N output ports, wherein each respective output port of the N output ports is coupled to a different respective corresponding coupling device of the N coupling devices, wherein for each respective coupling device of the N coupling devices: a respective current applied to the respective coupling device is determined by two or more of the plurality of binary signals to be sent.

13. The transmitter of claim 12, wherein the MIOP circuit comprises a MIOP amplifier.

14. The transmitter of claim 13, wherein in an activated state, the MIOP amplifier has, for small signals at each frequency in a frequency band used for transmission, a short-circuit transfer admittance matrix, wherein the short-circuit transfer admittance matrix is a complex matrix of size N×M, wherein two or more entries of each row of the short-circuit transfer admittance matrix are non-zero.

15. The transmitter of claim 14, wherein, at each frequency in the frequency band used for transmission, in each row of the short-circuit transfer admittance matrix, at least one entry different from an entry having the greatest absolute value has an absolute value greater than $1/100$ times the absolute value of the entry having the greatest absolute value.

16. The transmitter of claim 14, wherein the short-circuit transfer admittance matrix is a product of a frequency-independent real matrix and a diagonal matrix.

17. The transmitter of claim 14, wherein the MIOP amplifier uses a feedback that provides, at each frequency in the frequency band used for transmission, a short-circuit transfer admittance matrix in which two or more entries of each row are significantly different from zero.

18. A near-field multichannel transmission system comprising:
- a transmitter comprising:
  - a plurality (M) of transmission channels, wherein each transmission channel of the M transmission channels corresponds to a respective signal of a plurality of signals to be sent from a first monolithic integrated circuit to a second monolithic integrated circuit, wherein M is an integer greater than or equal to 2;
  - a plurality (N) of first coupling devices comprised in the first monolithic integrated circuit, wherein N is an integer at least equal to M, wherein each first coupling device of the N first coupling devices comprises a conducting surface sensitive to electric field variations; and
  - a multiple-input-port and multiple-output-port (MIOP) amplifier built in the first monolithic integrated circuit and comprising M input ports and N output ports, wherein each respective output port of the N output ports is coupled to a different respective corresponding first coupling device of the N first coupling devices;
  - wherein for each respective first coupling device of the N first coupling devices: a respective electrical variable applied to the respective first coupling device is determined by two or more of the plurality of signals to be sent.

19. The near-field multichannel transmitter system of claim 18, wherein the transmitter further comprises:
- M signal shaping circuits, wherein each respective signal shaping circuit of the M signal shaping circuits comprises:
  - an input port configured to receive a different respective corresponding signal of the plurality of signals to be sent; and
  - an output port coupled to a different respective corresponding input port of the M input ports of the MIOP amplifier.

20. The near-field multichannel transmitter system of claim 18, further comprising:
- a receiver comprising:
  - N second coupling devices built in the second monolithic integrated circuit, wherein each respective second coupling device of the N second coupling devices comprises a conducting surface sensitive to electric field variations, and wherein the N second coupling devices are configured to receive the plurality of signals by interacting with the N first coupling devices.

\* \* \* \* \*